United States Patent [19]
Bardsley et al.

[11] 3,934,983
[45] Jan. 27, 1976

[54] WEIGHING CELL APPARATUS FOR DIAMETER CONTROL OF A ROTATABLE GROWING CRYSTAL

[75] Inventors: William Bardsley, West Malvern; Geoffrey William Green, Malvern; Charles Harry Holliday, Newland; Donald Thomas James Hurle, Welland, all of England

[73] Assignee: National Research Development Corporation, London, England

[22] Filed: Sept. 7, 1973

[21] Appl. No.: 395,172

[30] Foreign Application Priority Data
Sept. 8, 1972 United Kingdom............... 41726/72

[52] U.S. Cl............ 23/273 SP; 23/301 SP; 156/601
[51] Int. Cl.² .................... B01J 17/00; B01J 17/20
[58] Field of Search.................... 23/301 SP, 273 SP

[56] References Cited
UNITED STATES PATENTS

| 2,558,281 | 1/1971 | Dyer | 23/273 SP |
|---|---|---|---|
| 2,908,004 | 10/1959 | Levinson | 23/273 SP |
| 3,206,286 | 9/1965 | Bennet et al. | 23/273 SP |
| 3,259,467 | 7/1966 | Rummel | 23/273 SP |
| 3,265,470 | 8/1966 | Keller | 23/301 SP |
| 3,275,419 | 9/1966 | Spielman | 23/301 SP |
| 3,284,172 | 11/1966 | Binder | 23/273 SP |
| 3,700,412 | 10/1972 | Higashi et al. | 23/273 SP |
| 3,761,692 | 9/1973 | Cope | 23/273 SP |

Primary Examiner—Norman Yudkoff
Assistant Examiner—Frank Sever
Attorney, Agent, or Firm—Cushman, Darby & Cushman

[57] ABSTRACT

Apparatus for the closed-loop controlled growth of crystalline material by the Czochralski technique includes means for establishing a melt of a given crystallisable material, means for pulling a crystal from said melt when established, said means for pulling incorporating a rigid elongated pulling member defining a crystal pulling axis, means for rotating said pulling member about said crystal pulling axis and a weighing cell located at the end of said pulling member distant from said means for establishing a melt and capable of providing, for the purpose of closed-loop control of said crystal pulled, a signal related to the force along said crystal pulling axis on the pulling member.

The weighing cell is preferably one of the kind having a spring and a transducer arranged to produce an electrical output related to the tension of the spring. The pulling member is preferably freely suspended from the weighing cell by a coupling which allows the pulling member to be rotated without rotating the weighing cell.

4 Claims, 5 Drawing Figures

WEIGHING CELL APPARATUS FOR DIAMETER CONTROL OF A ROTATABLE GROWING CRYSTAL

The present invention is related to apparatus for the growth of crystalline material.

In the Czochralski method of crystal growth individual crystals of a material are pulled from a melt of the material normally by means of a pull rod normally moving axially at a constant rate whilst rotating at a constant rate. The cross-sectional area perpendicular to the direction of growth, hereinafter called "the cross-sectional area", of the crystal being grown often has to be kept within well defined limits, so that the crystal meets the specification of a device in which it is to be used. Control of the cross-sectional area is also necessary when the crystal being grown is of an expensive material. The cross-sectional area of the crystal is often controlled manually by making adjustments to the power used to heat the melt. The operator making the adjustments needs to have considerable skill since it is necessary to adjust the power very carefully in order that the cross-sectional area of the crystal is at any time during the growth as near to the required magnitude as possible. In order to grow a crystal having an accurately uniform cross-sectional area along its length it is necessary for an operator to make adjustments continuously to the power; that is an unsatisfactory situation from the operator's point of view. In the other extreme situation, if adjustments are made too infrequently crystalline defects can be caused because the required adjustments are too large.

Open loop control of the heating power in a crystal pulling system can be used to control the cross-sectional area whilst the crystal is growing. In this case the power can, for example be varied according to a programme derived from the average setting of previous runs and by either electrical or mechanical means. However, when the crystal growth involves high temperatures, the programme required tends to vary between successive runs owing to such factors as changes in the thermal properties of the refractory materials used to surround the crucible containing the melt.

Closed-loop control of the power used in a crystal puller in order to control the size of the crystal pulled is desirable in most cases, particularly when, under certain circumstances, it is necessary to grow only one suitable crystal specimen of a given material. Such a specimen might otherwise required many growth attempts before it is obtained in a suitable form.

One known closed loop power control is used for growth of silicon crystals. During the pulling of silicon, the unusually high latent heat of fusion of the material perturbs the radial temperature gradient across the melt surface near the liquid/solid interface between the melt and the crystal. This perturbation allows information about the diameter (cross-sectional area) of the crystal to be derived by means of a narrow-angle radiation pyrometer sensor and to be used for closed loop control of the crystal growth. It appears that it is difficult to use this method for all stages of the crystal growth. It is necessary to make manual power adjustments in order to grow the crystal approximately to the required cross-sectional area before the closed loop control can be initiated. The method would not be very suitable for the many materials having latent heats of fusion much lower than that of silicon.

Another known closed-loop power control system involves the use of a laser beam. The beam is reflected from the meniscus near the melt/crystal interface and is used to monitor changes in the diameter (cross-sectional area) of the crystal in order to provide closed-loop control of the power. Again, it is apparent that an operator has to monitor the growth during the stages before the crystal reaches its required diameter.

Another known closed-loop system involves the use of closed-circuit television for sensing the crystal cross-sectional area. The magnitude of the crystal diameter is derived electronically from the scan lines which produce the television image of the crystal. Again, it is apparent that an operator has to monitor the growth during the stages before the crystal reaches its required cross-sectional area. Moreover, at high temperatures and in order to reduce radiation losses from the melt, it is necessary to restrict the angles from which the crystal can be monitored by the television system.

Closed-loop systems involving measurement of the weight of the growing crystal or the weight of the melt from which the crystal is grown have also been proposed. However, these systems do not make any provisions for maintaining the temperature distribution in the melt symmetrical about the crystal pulling axis; such provisions are desirable if it is desirable to grow the crystal uniformly about that axis.

According to the present invention apparatus for the growth of crystalline material includes means for establishing a melt of a given crystalline material, means for pulling a crystal from the melt when established, the means for pulling incorporating a rigid elongated pulling member defining a crystal pulling axis, means for rotating the pulling member about the crystal pulling axis and a weighing cell located at the end of the pulling member distant from the means for establishing a melt and capable of providing, for the purpose of closed-loop control of the crystal pulled, a signal related to the force along the crystal pulling axis on the pulling member.

Rotation of the pulling member allows the temperature distribution in the melt to be maintained symmetrical about the crystal pulling axis.

The pulling member is preferably a uniformly cyclindrical rod suspended freely from the weighing cell, preferably by a coupling, such as a self-aligning bearing, allowing the rod to be rotated without rotating the weighing cell. In that case a low-friction bearing such as a gas bearing, located in a position along the rod from the weighing cell, may be arranged to maintain the crystal pulling axis fixed relative to the means for establishing the melt.

The weighing cell is preferably one of the kind having a spring and a transducer arranged to produce an electrical output signal related to the tension of the spring.

The closed-loop control system may include means for producing a signal related to the expected value of the signal produced by the weighing cell, a comparator for comparing the two signals, and means capable of controlling the cross-sectional area of the pulled crystal in response to the output, if any, of the comparator. The means capable of controlling the cross-sectional area may be incorporated in the means for pulling, the means for rotating or the means for establishing the melt. The means for producing a signal is preferably a potentiometer whose variable contact can be varied in position linearly with time. In that case the electrical supply to the potentiometer preferably includes a nonlinear electrical element such as a silicon diode, to allow closed-loop control of the cross-sectional area during the early stages of crystal growth.

Alternatively, the closed-loop control system may include means for producing a signal related to a time differential function of the signal produced by the weighing cell, means for producing a signal related to the expected value of that function, a comparator for comparing the time differential function and its expected value and means capable of controlling the cross-sectional area of the crystal pulled in response to the output if any, of the comparator. The time differential function may be the first-order time derivative, or a higher order derivative, or a combination of various order derivatives, of the signal produced by the weighing cell.

Embodiments of the present invention will be described by way of example with reference to the accompanying drawings, in which.

Figure 1:
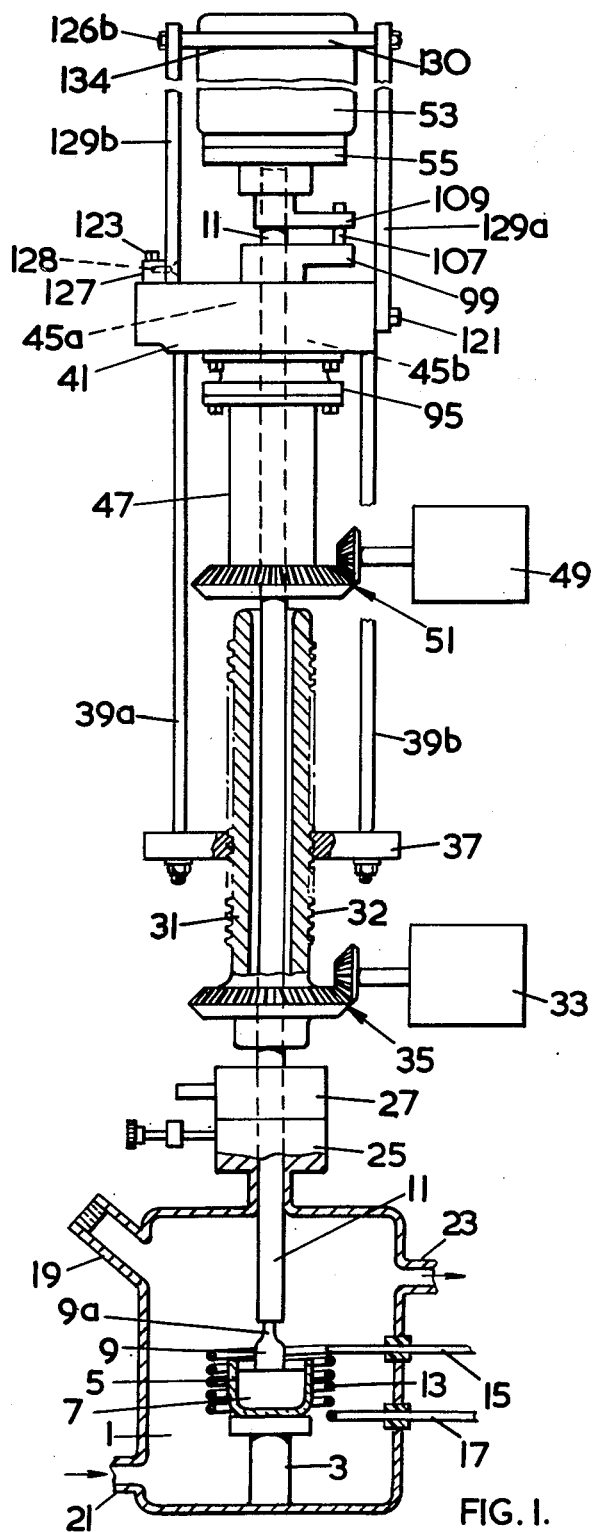
FIG. 1 is a diagram partly in cross-section of crystal pulling apparatus.
Figure 2:
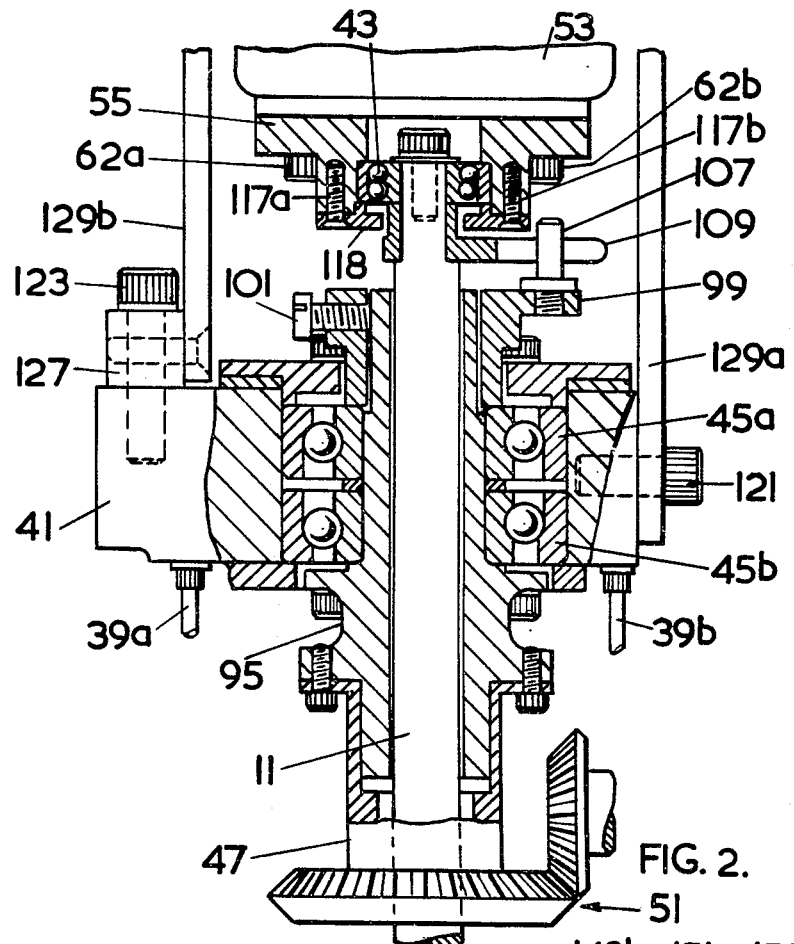
FIG. 2 is a diagram partly in cross-section in more detail of part of the apparatus described with reference to FIG. 1.
Figure 3:
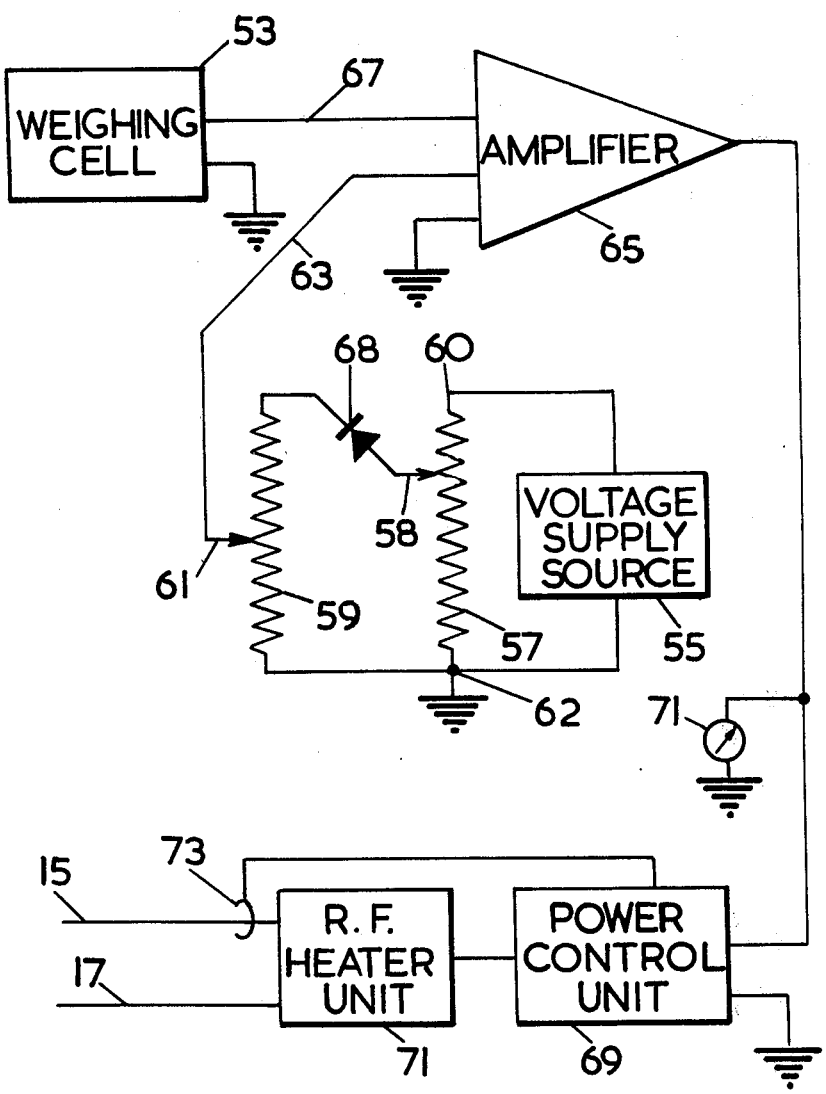
FIG. 3 is a schematic circuit diagram of an arrangement used to provide closed-loop control of the growth of a crystal using the apparatus described with reference to FIG. 1.

FIG. 1 is a diagram partly in cross-section of crystal pulling apparatus, and FIG. 2 is a diagram partly in cross-section in more detail of part of the apparatus described with reference to FIG. 1. A crystal growing vessel 1 has attached to its base a stand 3 supporting a cruicible 5 used for containing a charge 7 of molten material. A rod 11 is suspended at its upper end from a weighing cell 53 by a self-aligning bearing 43 (FIG. 2) and positioned near its lower end by a gas bearing 27. The lower end of the rod 11 carries a crystal seed 9a (attached by conventional means) which is initially dipped into the molten charge 7 and then slowly raised away from the molten charge 7 and rotated with the rod 11 (by means described below) allowing a single crystal 9 to grow. The charge 7 is heated by a coil 13 having connections 13, 15 to a radio frequency heater unit (FIG. 3). The crucible 5 acts as its own susceptor if it is electrically conducting. A separate susceptor (not shown) is located around the crucible 5 if the crucible 5 is not electrically conducting. The vessel 1 has a gas inlet port 21, a gas outlet port 23 leading to a vacuum pump (not shown) and a window 19 for observing the progress of the growth of the crystal 9.

During the growth of the crystal 9 the vessel 1 normally contains an inert gas atmosphere. The inert gas is pumped into the vessel 1 via the gas inlet port 21 after the vessel 1 has been evacuated via the gas outlet port 23. During the evacuation operation a sphincter valve 25 (described below with reference to FIG. 5) is used to seal the vessel 1 at the entrance to the vessel 1 of the rod 11.

The rod 11 must be free to be moved along its axis away from the molten charge 7 and to be rotated whilst not being subjected to any variable forces which could be recorded by the weighing cell 53.

A leadscrew 31, coaxial with part of the rod 11 external to the vessel 1, is used to produce axial translation of the rod 11. The leadscrew 31 bears along the major part of its length a screw thread 32. The leadscrew 31 is rotatable about its own axis and is driven by a motor 33 through bevel gears 35. The leadscrew 31 carries a leadscrew nut 37 having a thread engaged with the thread 32. Connecting rods 39a, 39b are secured at their lower ends to the leadscrew nut 37 and at their upper ends to an attachment member 41. A plate 129a is secured to the attachment member 41 by screws 121 (one shown in FIG. 1). A plate 129b is secured to the attachment member 41 by screws 128, 123 (one of each shown in FIG. 1) engaged with a block 127 adjacent to the plate 129b and to the attachment member 41. The weighing cell 53 is located between the plates 129a, 129b and is attached to the plates 129a, 129b by two bars 130 (one shown in FIG. 1) each engaged in a slot in the weighing cell 53 and each attached to the plates 129a, 129b.

As the leadscrew 31 is rotated by the motor 33 through the gears 35 the leadscrew nut 37 is moved along the leadscrew 31. The attachment member 41, the weighing cell 53 and the rod 11 are all fixed in height relative to the leadscrew nut 37 and therefore all move vertically together with the leadscrew nut 37.

The rod 11 is rotated in order to provide a radially symmetrical thermal environment for the growing crystal 9 and to provide stirring of the molten charge 7. A rotatable cylinder 47 coaxial with part of the rod 11 is driven by a motor 49 through bevel gears 51. The cylinder 47 is attached to a bush 95 carried in angular contact bearings 45a, 45b in the attachment member 41. A nut 99 carrying a pin 107 is secured on the end of the bush 95 and clamps the inner races of the angular contact bearings 45a, 45b to the bush 95. The pin 107 rides between the fingers of a two-fingered fork member 109 attached to the upper end of the rod 11. The fingers of the fork member 109 are coated with a layer of p.t.f.e. (polytetrafluoroethylene) in order to reduce frictional wear between the fork member 109 and the pin 107. This arrangement allows the rod 11 to be rotated at the same rotational speed as the cylinder 47 whilst being maintained in a vertical position and without being subjected to any variable forces which would be recorded by the weighing cell 53.

A housing 55 is secured by screws 62a, 62b to the base of the weighing cell 53. An annual member 118 is secured to the housing 55 by screws 117a, 117b and clamps the outer race of the self alinging bearing in the housing 55. The inner race of the self-aligning bearing 43 is clamped on the upper end of the rod 11 by a screw 119. This arrangement acts as a universal suspension joint between the rod 11 and the weighing cell 53.

The weighing cell 53 consists of a spring balance providing as an output an electrical signal. The output electrical signal from the weighing cell 53 is used to monitor continuously vertical force acting on the rod 11 as the crystal 9 grows. The weighing cell 53 may be a Series 6005 or 6005C Weighing Cell manufactured commercially by Hunting Engineering Limited of Dallas Road, Bedford, England. This contains flexure plates attached to a spring and rigidly attached to the moving armature of a linear variable differential transformer. When a force is applied to one of the plates against the action of the spring, the armature is moved, and the output electrical signal from the transformer which is proportional to the force applied is changed.

The force detected by the weighing cell 53 is the sum of several components, which are discussed below some of which, such as the weight of the rod 11 and its attachments, remain essentially constant throughout the growth of the crystal 9. The effect of the constant components may be ignored by pre-setting the output signal from the weighing cell to zero before growth of the crystal 9 is begun with the constant components acting on the weighing cell 53.

The electrical signal output from the weighing cell 53 is compared with a similar electrical signal providing a measure of the expected vertical force on the rod 11 at any given time, and the signal of any difference between the two is used in closed circuit control to adjust the crystal growth process.

FIG. 3 is a circuit diagram of the arrangement used to provide the closed-loop control of the crystal growth process. An electrical voltage supply source 55 is connected across a resistor 57 having a positive end 60 and an earthed end 62. A fraction of the voltage across the resistor 57 is applied across a resistor 59 in parallel with the resistor 57 by means of a variable contact 58 to the resistor 57. A non-linear element 68 is located between the contact 58 and the resistor 59. The resistor 59 has a variable contact 61. A connection 63 is attached from the contact 61 to a linear differential amplifier 65. The linear differential amplifier 65 also has an input connection 67 leading from the weighing cell 53. The output of the amplifier 65 which consists of a signal representative of the difference between the potential on the connection 67 and that on the connection 63 is fed to a conventional power control unit 69. The signal may be monitored by means of a meter 71.

The power control unit 69 provides stabilization of the output power from a conventional crystal growing r.f. heater unit 72 which produces the r.f. power in the connections 15, 17 for for supplying the r.f. heating coil 13 (shown in FIG. 1). The r.f. current flowing in the connection 15 is monitored by means of a conventional current transformer 73 and the monitor current is fed back to the power control unit 69, squared in the power control unit 69 and used in a standard way to stabilise any fluctuations in the power supplied by the power control unit 69 to the r.f. heater unit 72. The signal output from the amplifier 65 is also squared at the power control unit 69 and is used to modulate the power supplied by the power control unit 69 to the r.f. heater unit 72.

The temperature distribution across the charge 7 is determined by the level of the power supplied by the coil 13. When the power is increased the positions of the temperature isotherms across the charge 7 are raised, and when the power is decreased the positions of the isotherms are lowered. The cross-sectional area of the crystal 9 is determined by the positions of the isotherms. Therefore the cross-sectional area of the crystal 9 is governed by the level of the power supplied by the coil 7 which in turn is governed by the level of power supplied by the power control unit 69 to the r.f. heater unit 71. Therefore, any correction which needs to be made to the cross-sectional area of the crystal 9 is made by virtue of the amplifier 65 supplying the power control unit 69 with a signal whose magnitude is representative of the extent of the required correction.

It is shown below that the output of the weighing cell 53 which consists of a measure of the variable vertical force exerted on the rod 11, is indicative in this embodiment of the invention of any required change in cross-sectional area of the crystal 9.

The position of the contact 58 is adjusted automatically during the growth of the crystal 9 so that the potential of the contact 58 continuously varies from its minimum value to its maximum value during the period of the growth. This allows a continuously varying potential difference to be applied across the resistor 59. The contact 61 is pre-set to allow a constant fraction of that potential difference to applied as a reference signal to the amplifier 65. The position of the contact 61 may be calculated before the growth process is begun from the density of the crystalline material of the crystal 9 and its expected rate of growth.

During the early stages of crystal growth, ie normally for about the first one-tenth of the crystal growing time, it is necessary to increase the cross-sectional area from that of the seed 9a to that of the crystal 9. This is carried out automatically by the nonlinear element 68, which is conveniently a forward-biased diode such as a silicon diode. The element 68 allows the potential at the positive end of the resistor 59 to rise according to the forward characteristic of the element 68. Normally, forward-biased diodes have a forward current characteristic which is a square law with time up to about 1 volt and are ohmically conducting at higher forward voltages. Therefore, the output voltage from the source 55 is conveniently about 10 volts, allowing the cross-sectional area to be increased from that of the seed 9a to that of the crystal 9 according to an equivalent square-low with time during the first one-tenth of the travel of the contact 58.

Figure 4:
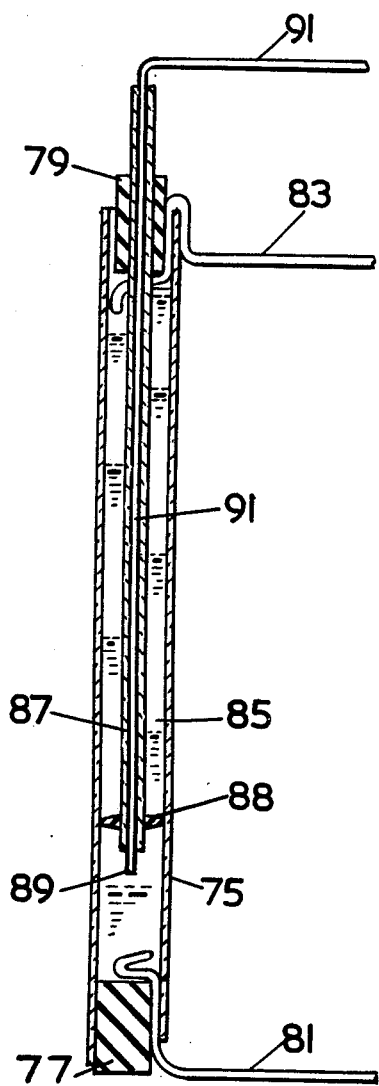
FIG. 4 is a cross-sectional diagram of potentiometer apparatus which may be used in the circuit described with reference to FIG. 3.

The potentiometer incorporating the contact 58 and the resistor 57 needs to be in which the contact 61 is moved at the same rate at which the crystal 9 grows in length. One example of a form which the potentiometer may take is illustrated in FIG. 4 which is a cross-sectional diagram of apparatus constituting the potentiometer. A glass tube 75 contains a stopper 77 at one end and a loose fitting cap 79 at the other end. A wire 81 is attached to one end of the tube 75 by means of the stopper 77, the end of the wire 81 being inside the tube 75. A wire 83 is located at the other end of the tube 75, the end of the wire 83 being inside the tube 75. The tube 75 is filled with a conducting liquid 85 such as common salt solution which may be covered by a layer of oil to minimise evaporation. A glass tube 87 containing a wire 91 exposed at a tip 89 to the liquid 85 is also located in the tube 75. The tube 87 passes slidably through the tube 75 by means of a polythene spacer 88 attached to the tube 87. The tube 87 also passes slidably through the cap 79. The wire 91 extends beyond the end of the tube 87 outside the tube 75.

The wire 81 constitutes the earthed end 62 of the resistor 57 (FIG. 3) and the wire 83 constitutes the positive end 60 of the resistor 57. The liquid 85 between the wires 83, 81 constitutes the resistor 57, and the tip 89 of the wire 91 in the liquid 85 constitutes the contact 58. The concentration of the liquid 85 is adjusted before the crystal process is begun in order to provide the appropriate resistance. The tube 87 is attached at its end outside the tube 75 to the leadscrew nut 37 (FIG. 1) by conventional means (not shown) which allow the tube 87, and therefore the tip 89, to be moved through the liquid 85 at the same rate at which the leadscrew nut 37 is moved along the leadscrew 31. Therefore, as the end 89 of the wire 91 inside the liquid 85 approaches the wire 83 the potential of the wire 91 is continuously increased. The potential difference between the tip 89 and the earthed end 62 (the wire 81) of the resistor 57 is used, as explained above, as a continuously increasing potential difference applied across the resistor 59, a constant fraction of that potential difference being used (via the connection 63) as a continuously increasing reference signal for the amplifier 65. The position of the leadscrew nut 37 along the leadscrew 31, on which the potential of the wire 91 is dependent, is itself a measure of the length of the crystal 9. This is because the leadscrew nut 37 is fixed in height relative to the rod 11 to which the crystal 9 is attached. The position of the leadscrew nut 37 is not an absolute a measure of the length of the crystal 9 because the length of the crystal 9 will also be increased by virtue of the level of the molten charge 7 falling. Also the vertical distance moved by the leadscrew nut 37 will not in general be equal to the vertical distance moved by the rod 11 because of deflection of the plate of the weighing cell 53 against the action of its spring. However, these errors in the length of the crystal 9 as measured by the potential of the wire 91 will in general be very small; and since they are always a constant proportion of the true length, provided in the former case that the crucible 5 is of uniform cross-sectional area in the region of the interface between the charge 7 and the crystal 9, they can be taken into account when setting the contact 61.

As an alternative to the potentiometer incorporating the resistor 57, the contact 58 with the element 68 it is possible in an alternative embodiment of the invention to use a potentiometer whose resistance varies non-linearly with distance over about the first one-tenth of the travel of its variable contact.

Figure 5:
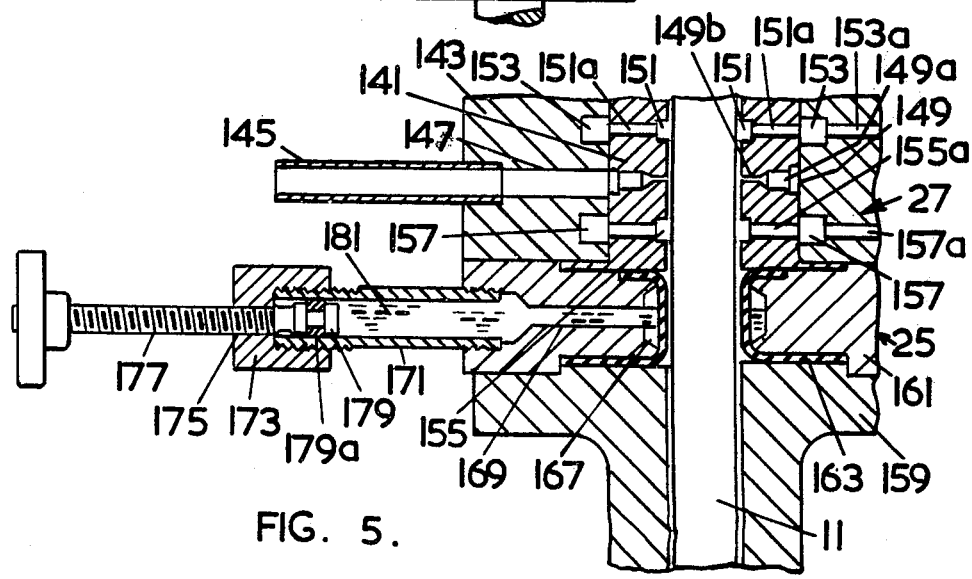
FIG. 5 is a cross-sectional diagram in more detail of part of the apparatus described with reference to FIG. 1.

FIG. 5 is a cross-sectional diagram of the gas bearing 27 and the sphincter valve 25 in the apparatus described with reference to FIG. 1. The gas bearing 27 includes an inner cylinder 141 surrounded by an outer cylinder 143. A gas inlet tube 145 is inserted in the outer cylinder 143 in a hole 147. The hole 147 extends to the inner cylinder 141. At the inner cylinder 141 the continuation of the hole 147 consists of an annular recess 149 leading to a series of holes 149a and gas jet holes 149b leading inward toward the rod 11. An annual recess 151 is formed in the inner cylinder 141 above the gas jet holes 149b. Also, an annular recess 155 is formed in the inner cylinder 141 below the gas jet holes 149b. A series of holes 151a leads from the annular recess 151 to an annular recess 153 in the outer cylinder 143. A series of gas outlet holes 153a leads from the annular recess 153 to the external surface of the outer cylinder.

Gas, such as air or inert gas, is pumped along the gas inlet tube 145 and the hole 147, into the annular recess 149 and along the holes 149a and the gas jet holes 149b. In this way a series of jets of the gas is formed to act as a constant force upon the rod 11 maintaining it in a central position. The gas then enters the annular recesses 151, 155 passes through the holes 151a, 155a into the annular recesses 153, 157 and escapes through the gas escape holes 153a, 157a. The gas bearing 27 allows the rod 11 to be centralised without being subjected to variable frictional forces which would be recorded by the weighing cell 53.

The sphincter valve 25 is fitted between the gas bearing 27 and a neck 159 of the vessel 1. The sphincter valve 25 contains a cylinder 161. A rubber collar 163 is positioned in a recess 165 between the cylinder 161, the neck 159 of the vessel 1 and the inner cylinder 141 of the gas bearing 27. An annular recess 167 is contained in part of the cylinder 161 adjacent to the rubber collar 163. Leading from the recess 167 to one side of the cylinder 161 is a hole 169 in which is fitted a tube 171. A cap 173 is attached to the end of the tube 171. The cap 173 contains a hole bearing a female screw thread 175. A plunger 177 bears a male screw thread which is engaged with the female screw thread 175. An end 179 of the plunger 177 containing a seal ring 179a is located slidably inside the tube 171. The tube 171, the hole 169 and the recess 167 are filled with an hydraulic liquid 181.

The sphincter valve 25 allows the vessel 1 to be sealed whilst the vessel 1 is being evacuated and then filled with gas before growth of the crystal 9. As the plunger 177 is screwed into the cap 173 the liquid 181 is compressed causing the rubber collar 163 to collapse and grip the rod 11, thus sealing the vessel 1. The collar may similarly be released from the rod 11 by unscrewing the plunger 177. During growth of the crystal 9 the vessel 1 is sealed from contaminants by allowing gas to escape slowly from the vessel 1.

External means (not shown) may be provided to maintain constant positive pressure in the vessel 1 to avoid variable forces being experienced by the rod 11 due to gas pressure changes. Such means are necessary to avoid leakage of gas from the gas bearing 27 into the vessel 1 if (a) the gas delivered to the gas bearing 27 is not the inert for filling the vessel 1 and if (b) the pressure of the gas delivered to the gas bearing 27 would otherwise be greater than that in the vessel 1.

Also, a reservoir chamber (not shown) may be connected to the vessel 1 so that when the contents of the vessel 1 are heated during growth of the crystal 9 variations in the force experienced by the rod 11 due to dynamic action of the gas in the vessel 1 are damped because the gas is allowed to escape into the reservoir chamber.

The weighing cell 53 is used to measure the vertical force on the rod 11. In the prior art it has been shown to be possible to measure the weight of the cruicible and the melt. Measurement of the vertical force on the pull rod is considered to be superior, however, for the following reasons.

With high-temperature growth processes some evaporative loss of weight of the crucible can occur which would thus produce a spurious weight change. Also, evaporation of the melt will occur in the case of certain materials giving the same result. Further, with the commonly used r.f induction heating of the crucible significant levitation forces may occur. These would appear as spurious changes in weight. Furthermore the "dead weight" of the melt and the crucible and its supports would in general be significantly greater than that of the weight of the pull rod used and the crystal, so that it would be very difficult to obtain a satisfactory sensitivity using the alternative technique mentioned above.

The vertical force $f$ measured by the weighing cell 53 is formed from several contributions. Firstly, there is the weight of the rod 11, and its attached parts. Secondly, there is the weight of the crystal 9. Thirdly, there is the buoyancy force provided by an ambient gas in the vessel 1. Fourthly, there is the weight of the liquid (the molten charge 7) which is supported by surface tension, ie in the form of a neck, and finally there is the vertical component of the surface tension force itself.

If the crystal 9 is growing at a steady speed as a right circular cylinder then the rate of increase of the force $df/dt$ will be constant and will be proportional to the square of the diameter $d$ of the crystal 9 (which is a measure of the cross-sectional area). However if the diameter $d$ of the crystal 9 is changing with time the weight of supported liquid and the component of the surface tension in the vertical direction will also be changing with time and the rate of increase of $df/dt$ will no longer be simply proportional to the square of the diameter of the crystal 9 at the liquid/solid interface.

It has been found that the manner by which $df/dt$ changes as $d$ changes depends on whether or not the material of the charge 7 in its crystalline state is more or less dense than in its molten state.

For materials which have the higher density when in their crystalline state, and are grown at a finite growth rate, $df/dt$ increases smoothly as $d$ increases but not, in general, strictly proportionally to $d^2$. For this class, of materials however, the closed-loop control system described above with reference to FIG. 1 and FIG. 3, in which the force f is measured and compared with its expected value, is quite satisfactory. It is also possible to provide apparatus incorporating a similar control system but by means of which $df/dt$ is measured, and compared with a constant reference signal (the expected value of $df/dt$ being constant). Differences between the measured value of $df/dt$ and the reference signal are then used in the same manner as described above (with reference to FIG. 1 and FIG. 2) to control the cross-sectional area of the crystal 9.

However for materials which have a higher density in their molten state than in their crystalline state, which are grown at a finite growth rate, the dependence of $df/dt$ on $d$ is not smooth and depends strongly on the rate at which $d$ is changing (except for very slow rates of change of $d$). A situation can occur where, as $d$ begins to increase, $df/dt$ first decreases and then later increases.

Conversely if $d$ begins to decrease $df/dt$ may first increase and then decrease. Many of the semiconducting materials, for example Ge, Si, GaAs and GaP fall within this category of materials.

This effect leads to instabilities if the closed-loop control system described above with reference to FIG. 1 and FIG. 2 is used. The effect is more likely to occur at low growth rates. To overcome these instabilities processing of the signal obtained from the weighing cell 53 must be undertaken. This processing must produce a signal which is representative of the diameter (or the cross-sectional area) of the crystal 9 at the liquid/solid interface. This can be achieved in several ways, for example:

a By analgoue simulation of the differential equation which describes the dependence of the force $f$ on the diameter (or the cross-sectional area) of the crystal 9, or a time derivative of that dependence.

b By digital simulation of the equation using a small computer.

c More approximately, by integrating the signal from the weighing cell 53 applied along the connection 67 for a time which must optimised by experimentation, but which is approximately equal to $$\frac{d}{2v}\left(1 - \frac{1c}{1m}\right)$$

where $v$ is the pulling velocity and $1c$ and $1m$ are the densities of the crystal 9 and molten charge 7 respectively.

The processed signal must then be compared with a reference signal constituting the expected value of the processed signal. The signal produced by the comparison of those two signals may then be used in the manner described above with reference to FIG. 1 and FIG. 2 to control the cross-sectional area of the crystal 9.

It will be apparent to those skilled in the art that closed-loop control of the cross-sectional area (diameter) of the crystal 9 (FIG. 1) may be achieved by applying the output signal provided by the amplifier 65 (FIG. 3) not to the power control unit 69 (FIG. 1) but to either of two power control units (not shown) which would normally be used to drive respectively the motor 33 and the motor 49. Modulation of the power delivered to the motor 49 or to the motor 33 by this means provides a change in one case in the rate of rotation of the rod 11 and in the other case in the rate of vertical translation of the rod 11. Either change results in a corrective change in the cross-sectional area of the growing crystal 9.

It will also be apparent to those skilled in the art that the invention may be used in connection with certain particular techniques for the growth of crystals by pulling such as the techniques known in the art as the pedestal technique, an example of which is described by W C Dash in J. Applied Physics 29, page 736 (1958); or the float-zone technique, an example of which is described by P H Kech and M J H Goley in Physical Rev 89 page 1297 (1953); or the liquid encapsulation technique which is described in UK patent specification No. 1,113,069 and U.S. patent specification No. 3,401,023.

We claim:

1. Apparatus for the growth of crystalline material including means for establishing a melt of a given crystallizable material, a pull rod arranged for pulling a crystal from said melt when established, means for lifting said pull rod from said melt to pull said crystal on one end of said rod, means for rotating said pull rod about its axis while said rod is being lifted, said means for rotating including a substantially tubular member surrounding said rod and attached to said rod whereby said rod rotates together with said member, and a construction for monitoring the weight of said crystal for the purpose of closed-loop control of said crystal comprising a weighing cell attached to said rod near the end of said rod opposite to said first mentioned end to measure the weight of said rod and said crystal, a weighing cell support housing arranged to support said weighing cell, said support housing including a support plate having an aperture through which said rod and said tubular member pass, said support plate being arranged so as to be lifted by said lifting means whereby said housing, said weighing cell and said rod are all lifted together and, located in said aperture, a bearing having an inner race fixed to said tubular member and outer race fixed to said support plate whereby said tubular member is attached to said support plate and said tubular member and said rod may be rotated without rotating said support plate.

2. Apparatus as claimed in claim 1 and wherein said means for pulling comprises, in fixed positional relationship to one another, a rotatable leadscrew, a leadscrew nut engaged with said leadscrew and movable along said leadscrew by rotation of said leadscrew and at least one connecting member connecting said leadscrew nut and said support plate, whereby positional translation of said leadscrew nut causes positional translation of said support housing, said weighing cell and said pull rod.

3. Apparatus as claimed in claim 1 and wherein a coupling is located between said pull rod and said weighing cell, said coupling comprising a self-aligning bearing having an inner race clamped to one end of said pulling member and having an outer race connected to said weighing cell, and wherein said tubular member is connected to said inner race of said self-aligning bearing.

4. Apparatus as claimed in claim 2 and wherein said coupling comprises a self-aligning bearing having an inner race clamped to one end of said pulling member and having an outer race connected said weighing cell, and wherein said tubular member is connected to said inner race of said self-aligning bearing, wherein said bearing in said aperture of said support plate is an angular contact bearing and wherein said apparatus comprises a pin connected to said inner race of said angular contact bearing and rotatable with said tubular member, and connected to said inner race of said self-aligning bearing, a fork member in which said pin is located, whereby rotation of said pin produces rotation of said inner race of said self-aligning bearing and of said pull rod.

* * * * *